(12) United States Patent
Wang et al.

(10) Patent No.: US 9,899,958 B2
(45) Date of Patent: Feb. 20, 2018

(54) PORTABLE SOLAR POWER SUPPLY WITH HIGH HEAT RADIATION PERFORMANCE

(71) Applicant: GuangDong Solarstock New Energy Technology Limited, Shenzhen, Guangdong (CN)

(72) Inventors: Ninggang Wang, Guangdong (CN); Qiang Li, Guangdong (CN)

(73) Assignee: Guangdong Solarstock New Energy Technology Limited, Shenzhen (CN)

( * ) Notice: Subject to any disclaimer, the term of this patent is extended or adjusted under 35 U.S.C. 154(b) by 311 days.

(21) Appl. No.: 14/897,634

(22) PCT Filed: May 6, 2015

(86) PCT No.: PCT/CN2015/078378
§ 371 (c)(1),
(2) Date: Dec. 10, 2015

(87) PCT Pub. No.: WO2016/074450
PCT Pub. Date: May 19, 2016

(65) Prior Publication Data
US 2016/0373054 A1 Dec. 22, 2016

(30) Foreign Application Priority Data

Nov. 14, 2014 (CN) .................. 2014 2 0685231 u

(51) Int. Cl.
*H02S 40/42* (2014.01)
*H02J 7/00* (2006.01)
(Continued)

(52) U.S. Cl.
CPC ............ *H02S 40/425* (2014.12); *H02J 7/355* (2013.01); *H02S 10/40* (2014.12); *H02S 40/38* (2014.12); *H05K 7/20* (2013.01); *H05K 7/20909* (2013.01); *H02J 7/0047* (2013.01); *H02J 2007/005* (2013.01)

(58) Field of Classification Search
CPC .. H02J 7/355; H02J 2007/0001; H02J 7/0054; H02J 7/0047; H02J 2007/005; H02S 10/40; H02S 40/38; H02S 40/425; H02S 20/00; H02S 20/30; H05K 7/20; H05K 7/20909
See application file for complete search history.

(56) References Cited

U.S. PATENT DOCUMENTS 7,565,968 B2 * 7/2009 Lindley .................. A62B 99/00
206/223

* cited by examiner

*Primary Examiner* — Jinhee Lee
*Assistant Examiner* — Ingrid Wright

(57) ABSTRACT

Disclosed is a portable solar power supply, which includes a housing, a front cover and a rear cover, and further includes a wind deflector and an exhaust fan fixed on the wind deflector; the front cover has an air outlet and an air inlet formed thereon; the housing is divided into an upper chamber and a lower chamber which is connected with the air inlet and has battery installed therein removably; the wind deflector is installed in the upper chamber removably and forms an air outlet channel together with inner wall of the upper chamber; the air outlet channel and an air inlet channel are separated by the wind deflector; and one side of the air inlet channel is connected with the air inlet and the other side of the air inlet channel is connected with the air outlet channel. It has good heat radiation performance.

10 Claims, 2 Drawing Sheets

(51) Int. Cl.
  *H02J 7/35* (2006.01)
  *H02S 10/40* (2014.01)
  *H02S 40/38* (2014.01)
  *H05K 7/20* (2006.01)

PORTABLE SOLAR POWER SUPPLY WITH HIGH HEAT RADIATION PERFORMANCE

FIELD OF THE INVENTION

The present invention relates to portable power supplies, and more particularly to a portable solar power supply with high heat radiation performance.

BACKGROUND OF THE INVENTION

Portable solar power supply has been widely used due to its advantages of small size, easy to carry, being able to supply power to some electric appliances and being able to recharge in time. However, with the increase of capacitance of the portable solar power supply, the continuous charging and discharging will cause the housing to be too hot and even cause the components such as battery to be damaged, thereby affecting the usage life of the portable solar power supply.

SUMMARY OF THE INVENTION

An object of the present invention is to provide a portable solar power supply with high heat radiation performance so as to overcome the defects of the prior art.

To achieve above objects, there is provided a technical solution as follows:

There is provided a portable solar power supply with high heat radiation performance, which includes a housing, a front cover provided on a front part of the housing and a rear cover provided on a rear part of the housing, and further includes a wind deflector, an exhaust fan and a Z-shaped wind deflector, the exhaust fan being fixed on the wind deflector. A plugin panel is provided on the front part of the housing for fixing input interface and output interface and supported by the front cover which has notches formed thereon for accommodating the input interface and the output interface; the front cover has an air outlet formed on an upper part thereof and an air inlet formed on a lower part thereof; the housing is divided into an upper chamber and a lower chamber which is connected with the air inlet and has battery installed therein removably; the wind deflector is installed in the upper chamber removably and forms an air outlet channel together with inner wall of the upper chamber; the air outlet channel and an air inlet channel are separated by the wind deflector at a position which is close to the front cover; and one side of the air inlet channel is connected with the air inlet and the other side of the air inlet channel is connected with the air outlet channel at a position which is close to the rear part of the housing.

According to the above solution, under the action of exhaust fan, the external air can pass through the air inlet, air inlet channel, battery, air outlet channel and air outlet successively, thus the heat produced by the battery can be brought into the air outlet channel from the air inlet channel and then be brought out of the housing via the air outlet, thereby reducing the heat accumulation in the housing and prolonging service life of the battery.

In a preferred embodiment, there are several slide rails formed on the inner wall of the lower chamber and several slide sheets, corresponding to the slide rails, formed on outer wall of the battery; and there is a clearance provided between the battery and the inner wall of the lower chamber.

According to the above solution, cooperation of the slide rails and the slide sheets can make the battery easy to slide in and slide out of the lower chamber. Due to the setting of clearance between the battery and the inner wall of the lower chamber, the external air can enter into the clearance by passing through the lower of the plugin panel, thereby the heat produced by the battery will be brought out of the clearance and then into the air outlet channel and finally out of the housing.

In a preferred embodiment, there are energy absorbers provided in the slide rails.

According to the above solution, the energy absorbers are provided for supplying buffer action so as to protect the battery.

In a preferred embodiment, the portable solar power supply further includes a sealing cover, which is connected with the wind deflector hermetically.

According to the above solution, the sealing cover is connected with the wind deflector hermetically so as to prevent the air from entering into the air outlet channel directly without passing through the battery.

In a preferred embodiment, the portable solar power supply further includes an inverter board, which is fixed on the wind deflector and close to the rear cover.

In a preferred embodiment, the portable solar power supply further includes a control board, which is fixed on the wind deflector and close to the front cover.

According to the above solutions, under the action of exhaust fan, the external air can pass through the air inlet, air inlet channel, battery, inverter board, control board, air outlet channel and air outlet successively, thus the heat produced by the battery, inverter board and control board can be brought out of the air inlet channel and then into the air outlet channel and finally be brought out of the housing via the air outlet, thereby reducing the heat accumulation in the housing and prolonging service life of the battery, inverter board and control board.

In a preferred embodiment, the plugin panel is further provided with a power switch, a battery level indicator and a status indicator; the input interface comprises external charging interface, solar charging interface and adapter charging interface; and the output interface comprises AC220V output interface, DC12V output interface, USB charging output interface and auto start-up output interface.

According to the above solution, the battery level indicator is used to display the electric quantity of the battery, the status indicator is used to show the working status, including the power switch being switch on or shutdown, charging state of the battery and failure indication. The external charging interface, solar charging interface, adapter charging interface, AC220V output interface, DC12V output interface, USB charging output interface and auto start-up output interface are provided to realizing multifunction of the portable solar power supply with high heat radiation performance.

In a preferred embodiment, the portable solar power supply further includes a door, which is hinged on outer side of the front cover and there is a waterproofing part provided between the door and the front cover.

In a preferred embodiment, the portable solar power supply further includes an auto start-up guard plate which is fixed on the battery and connected with the output interface and the input interface, respectively.

According to the above solution, when the storage battery of a car is dead, take an accessory connection line and make one end of the connection line connect to the auto start-up output interface and the other end of the connection line connect to the storage battery of the car so that it can charge the storage battery and then the car can be started up. The auto start-up guard plate is provided to prevent the battery from being overload when starting up.

In a preferred embodiment, there is a handle provided on a top part of the housing.

The above-mentioned solutions have some beneficial effects as follows: due to the setting of air inlet, air inlet channel, air outlet channel, exhaust fan and air outlet, there is airflow formed in the housing, thus the heat produced by the battery, the inverter board and the control board will be brought out from the housing by the airflow, thereby avoiding heat congregation in the housing and bringing good heat dissipation effect; due to the clearance between the battery and inner wall of the lower chamber and the EVA provided in the clearance, it prevents the battery from slamming again the inner wall of the lower during moving of the portable solar power supply with high heat radiation performance; and due to the setting of input interface, output interface, auto start-up output interface, USB charging output interface, power switch, battery level indicator and status indicator, all of which are provided on the plugin panel, the present invention has a variety of functions, including charging and discharging for battery.

Other aspects, features, and advantages of this invention will become apparent from the following detailed description when taken in conjunction with the accompanying drawings, which are a part of this disclosure and which illustrate, by way of example, principles of the present invention.

DETAILED DESCRIPTION OF ILLUSTRATED EMBODIMENTS

Some embodiments of the present invention will be described as follows, by way of example only, with reference to the accompanying drawings.

Figure 1:
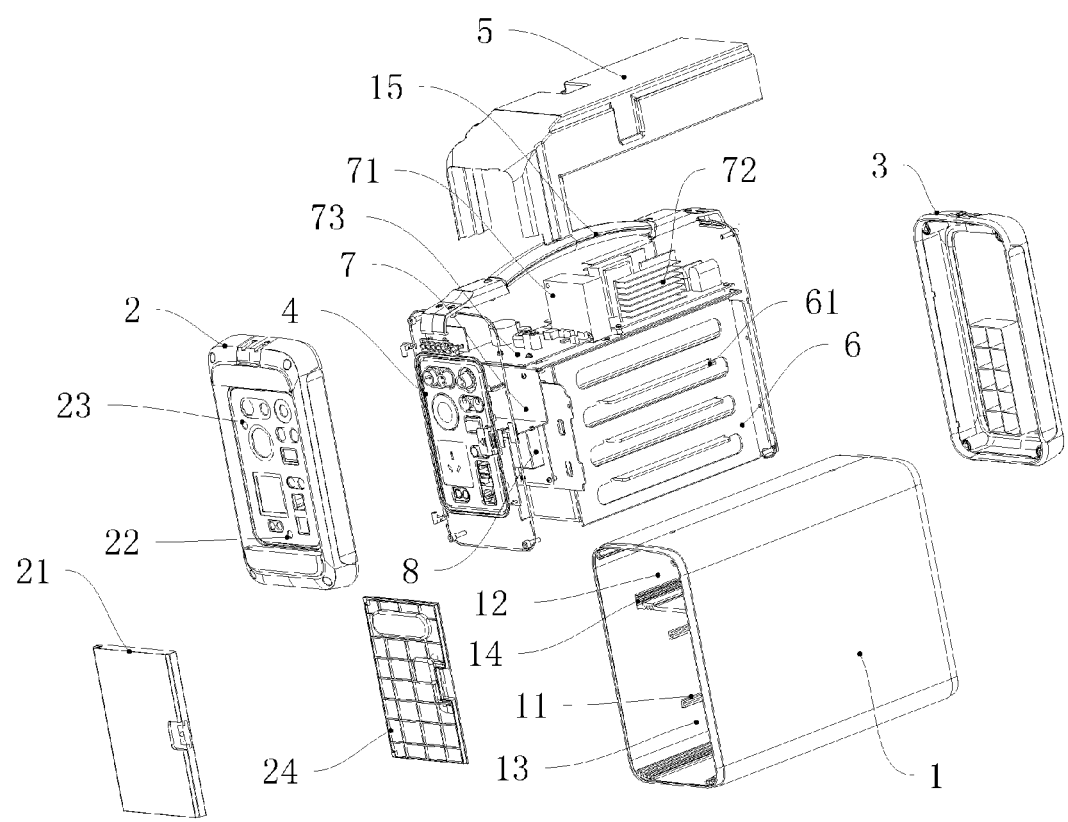
FIG. 1 is an exploded view of the present invention.
Figure 2:
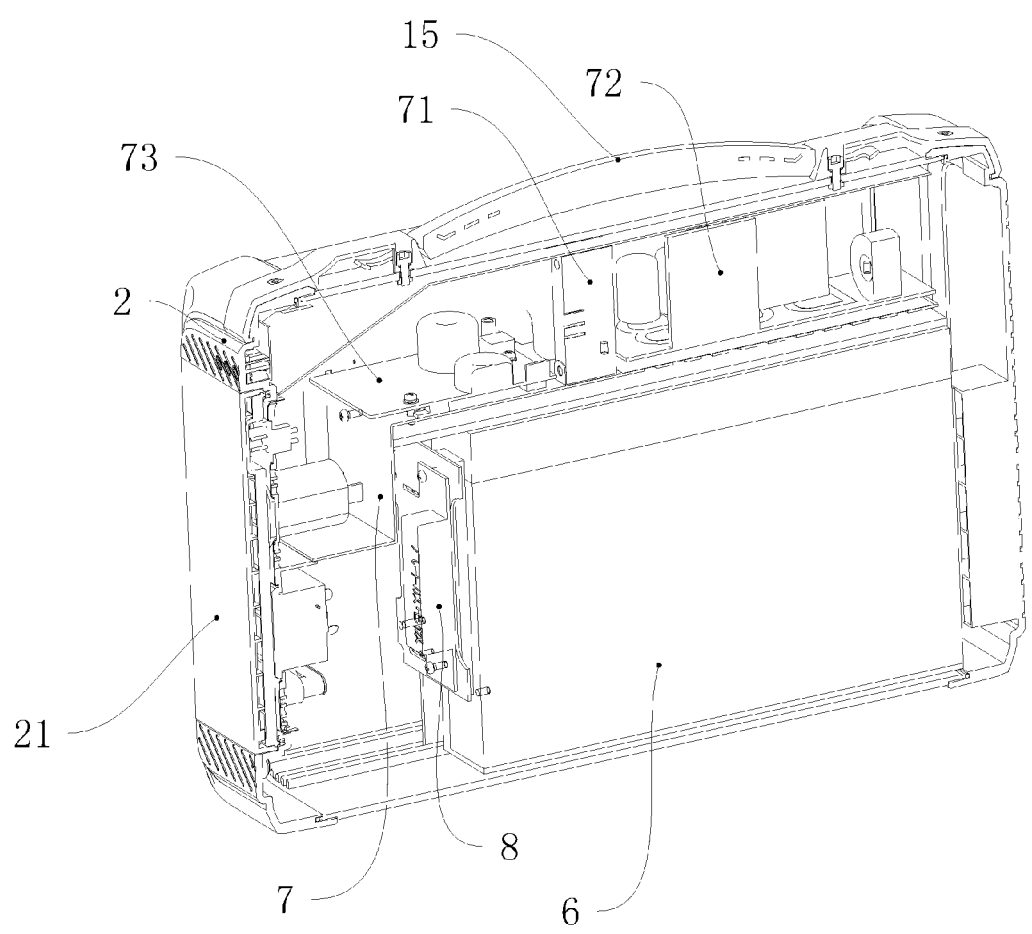
FIG. 2 is a section view of the present invention.

As shown in FIG. 1 and FIG. 2, according to an embodiment of the present invention, the portable solar power supply with high heat radiation performance includes a housing 1, a front cover 2 provided on a front part of the housing 1 and a rear cover 3 provided on a rear part of the housing 1, and further includes an exhaust fan 71 and a Z-shaped wind deflector 7. The exhaust fan 71 is fixed on the wind deflector 7. There is a plugin panel 4 provided on the front part of the housing 1 for fixing input interface and output interface and supported by the front cover 2 which has notches formed thereon for accommodating the input interface and the output interface. The front cover 4 is provided with an air outlet 23 formed on an upper part thereof and an air inlet 22 formed on a lower part thereof. The housing 1 is divided into an upper chamber 12 and a lower chamber 13. The lower chamber 13 is connected with the air inlet and there is a battery 6 installed in the lower chamber 13 removably. The wind deflector 7 is installed in the upper chamber 12 removably and forms an air outlet channel together with inner wall of the upper chamber 12. The air outlet channel and an air inlet channel are separated by the wind deflector 7 at a position which is close to the front cover 2; and one side of the air inlet channel is connected with the air inlet and the other side of the air inlet channel is connected with the air outlet channel at a position which is close to the rear part of the housing.

The upper chamber 12 is provided with slide rail formed on the inner wall thereof. The wind deflector 7 is able to insert into the slide rail and the wind deflector 7 is Z-shaped. The air outlet channel and an air inlet channel, close to the front cover 2, are separated by the wind deflector so that the outside air is able to enter into the air inlet channel only via the air inlet 22 and the wind is able to flow from the air outlet channel only via the air outlet 23. Under the action of the exhaust fan 71, the outside air will flow into the air inlet channel via the air inlet 22, and then flow out from the air outlet channel via the air outlet 23 so that the heat produced by the battery 6, the control board 73 and the inverter board 73 when charging and discharging will be brought out from the housing 1 by the airflow. Thus the heat accumulation in the housing will be reduced and it can prevent the battery from being damaged due to overheating and can prevent the hands of user from being hurt due to the hot housing.

In this embodiment, there are several slide rails 11 formed on the inner wall of the lower chamber 13 and several slide sheets 61, which are corresponding to the slide rails 11, formed on outer wall of the battery 6; and there is a clearance provided between the battery 6 and the inner wall of the lower chamber 13. The slide rails are provided with energy absorbers arranged therein and the energy absorbers could be EVA. By means of the slide rails 11, the battery 6 can slide in and slide out of the lower chamber 13 easily, which is convenient for assembly and disassembly of the battery. Due to the clearance provided between the battery and the inner wall of the lower chamber, the heat produced by the battery 6 will not be transmitted to the housing directly, thereby avoiding the housing 1 to be too hot to hurt the hands of user. At the same time, the heat produced by the battery 6 will be transmitted to the air outlet channel and then flow out from the upper chamber 12 via the air outlet 23.

The portable solar power supply further includes a sealing cover 5, which covers the wind deflector 7 and connects with the wind deflector hermetically. The portable solar power supply further includes an inverter board 72, which is fixed on the wind deflector 7 and close to the rear cover 3. The inverter board is provided to convert the direct current from the battery into alternating current which is supplied to external devices. The portable solar power supply further includes a control board 73, which is fixed on the wind deflector 7 and close to the front cover 2. Under the control of the control board 73, an external power supply can supply power to battery to make the battery charge, and the battery can supply power to an external device. The plugin panel 4 is further provided with a power switch, a battery level indicator and a status indicator; the input interface includes external charging interface, solar charging interface and adapter charging interface; and the output interface includes AC220V output interface, DC12V output interface, USB charging output interface and auto start-up output interface. The portable solar power supply further includes an auto start-up guard plate 8, which is fixed on the battery 6 and connected between the output interface and the input interface. When the storage battery of a car is dead, take an accessory connection line and make one end of the connection line connect to the auto start-up output interface and the other end of the connection line connect to the storage battery of the car so that it can charge the storage battery and then the car can be started up. The auto start-up guard plate is provided to prevent the battery from being overload when starting up.

The portable solar power supply further includes a door 21, which is hinged on outer side of the front cover 2 and there is a waterproofing part 24 provided between the door 21 and the front cover 2. There is a handle 15 provided on a top part of the housing 1. When the portable solar power supply with high heat radiation performance is not in use, the door 21 is closed to isolate the USB interface and power switch from the outside world, thereby achieving good water-proof and dust-proof performance. When the portable solar power supply with high heat radiation performance is in use, the door 21 is opened so that the auto start-up output interface and the USB charging output interface can connect with the external devices, respectively. The portable solar power supply is provided with handle 15, which is easy for the user to carry.

Above descriptions of embodiments are provided for further illustrating the technical content of the present invention, so as to facilitate understanding and it should be understood that the invention is not to be limited to the disclosed embodiments. Any technique extension and recreation according to the present invention should be included within the scope of protection of the invention.

What is claimed is:

1. A portable solar power supply with high heat radiation performance, comprising a housing, a front cover provided on a front part of the housing and a rear cover provided on a rear part of the housing, wherein further comprises a wind deflector, an exhaust fan and a Z-shaped wind deflector, the exhaust fan being fixed on the wind deflector; a plugin panel is provided on the front part of the housing for fixing input interface and output interface and supported by the front cover which has notches formed thereon for accommodating the input interface and the output interface; the front cover has an air outlet formed on an upper part thereof and an air inlet formed on a lower part thereof; the housing is divided into an upper chamber and a lower chamber which is connected with the air inlet and has battery installed therein removably; the wind deflector is installed in the upper chamber removably and forms an air outlet channel together with inner wall of the upper chamber; the air outlet channel and an air inlet channel are separated by the wind deflector at a position which is close to the front cover; and one side of the air inlet channel is connected with the air inlet and the other side of the air inlet channel is connected with the air outlet channel at a position which is close to the rear part of the housing.

2. The portable solar power supply with high heat radiation performance according to claim 1, wherein there are several slide rails formed on the inner wall of the lower chamber and several corresponding slide sheets formed on outer wall of the battery; and there is a clearance provided between the battery and the inner wall of the lower chamber.

3. The portable solar power supply with high heat radiation performance according to claim 2, wherein there are energy absorbers provided in the slide rails.

4. The portable solar power supply with high heat radiation performance according to claim 1, wherein further comprises a sealing cover, which is connected with the wind deflector hermetically.

5. The portable solar power supply with high heat radiation performance according to claim 1, wherein further comprises an inverter board, which is fixed on the wind deflector and close to the rear cover.

6. The portable solar power supply with high heat radiation performance according to claim 1, wherein further comprises a control board, which is fixed on the wind deflector and close to the front cover.

7. The portable solar power supply with high heat radiation performance according to claim 1, wherein the plugin panel is further provided with a power switch, a battery level indicator and a status indicator; the input interface comprises external charging interface, solar charging interface and adapter charging interface; and the output interface comprises AC220V output interface, DC12V output interface, USB charging output interface and auto start-up output interface.

8. The portable solar power supply with high heat radiation performance according to claim 1, wherein further comprises a door, which is hinged on outer side of the front cover and there is a waterproofing part provided between the door and the front cover.

9. The portable solar power supply with high heat radiation performance according to claim 1, wherein further comprises an auto start-up guard plate which is fixed on the battery and connected with the output interface and the input interface, respectively.

10. The portable solar power supply with high heat radiation performance according to claim 1, wherein there is a handle provided on a top part of the housing.

* * * * *